United States Patent
Moriue et al.

(10) Patent No.: US 11,762,191 B2
(45) Date of Patent: Sep. 19, 2023

(54) MIRROR DEVICE

(71) Applicant: Mitsubishi Electric Corporation, Tokyo (JP)

(72) Inventors: Shingo Moriue, Tokyo (JP); Hirofumi Konishi, Tokyo (JP); Fusako Tomizumi, Tokyo (JP); Yoshitaka Tsuboi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 421 days.

(21) Appl. No.: 17/073,526

(22) Filed: Oct. 19, 2020

(65) Prior Publication Data

US 2021/0165209 A1 Jun. 3, 2021

(30) Foreign Application Priority Data

Dec. 2, 2019 (JP) ................... 2019-217737

(51) Int. Cl.
G02B 26/08 (2006.01)
B81B 3/00 (2006.01)
G01S 7/481 (2006.01)

(52) U.S. Cl.
CPC ........ *G02B 26/0833* (2013.01); *B81B 3/0045* (2013.01); *G01S 7/4817* (2013.01); *B81B 2201/042* (2013.01); *B81B 2203/0154* (2013.01)

(58) Field of Classification Search
CPC .............. G02B 26/0833; B81B 3/0045; B81B 2201/042; B81B 2203/0154; G01S 7/4817
See application file for complete search history.

(56) References Cited

U.S. PATENT DOCUMENTS

| 2005/0179985 A1 | 8/2005 | Kato et al. |
| 2006/0175546 A1 | 8/2006 | Asai |
| 2016/0105090 A1* | 4/2016 | Sadaharu ............. G02B 26/101 310/38 |
| 2018/0148314 A1 | 5/2018 | Takimoto et al. |

FOREIGN PATENT DOCUMENTS

| JP | 2004-037987 A | 2/2004 |
| JP | 2004-264684 A | 9/2004 |
| JP | 2005-107069 A | 4/2005 |
| JP | 2010-128116 A | 6/2010 |
| JP | 4471271 B2 | 6/2010 |
| JP | 2010-169948 A | 8/2010 |
| JP | 2016-012042 A | 1/2016 |
| JP | 2017-151476 A | 8/2017 |
| JP | 2018-036671 A | 3/2018 |

OTHER PUBLICATIONS

Communication dated Dec. 15, 2020, from the Japanese Patent Office in application No. 2019-217737.

* cited by examiner

*Primary Examiner* — Euncha P Cherry
(74) *Attorney, Agent, or Firm* — Sughrue Mion, PLLC; Richard C. Turner

(57) ABSTRACT

In order to expand the surface area of a reflective layer, the space between adjacent turns of a drive coil, which is wound a plurality of turns on a peripheral edge front surface of the principal surface of a movable portion which, being inside a frame-formed support substrate, is connected to the support substrate by torsion bars, is filled and flattened with a smoothing layer, thereby adopting a configuration such that the reflective layer can also be provided in the region of the upper surface of the drive coil.

15 Claims, 11 Drawing Sheets

MIRROR DEVICE

BACKGROUND OF THE INVENTION

Field of the Invention

The present application relates to the field of a mirror device.

Description of the Related Art

As a ranging system which measures the distance to a target utilizing laser light, light detection and ranging (LiDAR) is known. The distance measurement of the LiDAR is such that the distance to a tar get is measured, using a time-of-flight (TOF) method, by measuring the period of time from when light is emitted from a light emitting device until when a light receiving device receives the light reflected from the target.

In the LiDAR, a mirror device fabricated using a micromachining technology is used as a device which controls light. The mirror device is configured of a mirror chip, formed of a reflector, a drive coil, and torsion bars, and a magnet. The mirror chip is formed by thinning one portion of a silicon substrate. The basic operating principle of controlling the angle of a mirror is based on Fleming's left-hand rule. The drive coil is disposed in a direction perpendicular to a magnetic field, and when current is caused to flow through the drive coil, a force is applied to the drive coil. The force is called a Lorentz force, and the magnitude thereof is proportional to the intensity of current and magnetic field.

The mirror is supported by torsion bars. The torsion bars, as well as being the rotation shaft of the mirror, act as torsion springs which suppress the rotation of the mirror. When current flows through the drive coil on the periphery of the mirror, the elastic force of torsion springs generated by the torsion bars, together with a torque which causes the mirror to rotate, works in a direction opposite to the rotation, and the rotation of the mirror stops when the two forces balance with each other. The intensity of the current flowing through the drive coil is changed, and thereby it is possible to control the torque and thus to change the angle of the mirror.

A mirror device described in PTL 1 is such that a support substrate is of a frame form, and that a magnetic field generating portion which corresponds to the drive coil is provided outside the support substrate. A movable portion supported by torsion bars is provided inside the frame form of the support substrate, and a reflective layer acting as the mirror is provided in the center of the movable portion, wherein the drive coil is provided in an outer peripheral portion of the movable portion so as to surround the reflective layer. The drive coil is connected by electrical wirings, by way of the torsion bars, to terminals provided on the support substrate.

[PTL 1] Japanese Patent No. 4,471,271

In order to widen the angle and increase the distance of the detection range of the LiDAR, it is effective to drive through a wide angle the movable portion of the mirror device which scans the light from the light emitting device and also to expand the area of the reflective layer which receives the light reflected from the target. In the mirror device of PTL 1, however, when the area of the reflective layer is increased, the area of the movable portion including the drive coil which compasses the periphery of the reflective layer increases, so that there is a problem in that the weight of the movable portion increases, reducing the deflection angle of the movable portion.

In order to increase a deflection angle $\theta$, it is required to lower the moment of inertia. That is, the measure of the deflection angle is inversely proportional to the weight of the movable portion, and the structure is not suitable to establish compatibility between an increase in distance and an increase in angle, so that there is the problem of having to adopt a structure focusing on either one.

SUMMARY OF THE INVENTION

The present application has been made to solve the above problem, and an object of the present application is to provide a mirror device which, by realizing a large-area reflective layer without increasing the weight of a movable portion, enables the compatibility with a deflection angle.

A mirror device disclosed in the present application includes a support substrate of a frame form; a movable portion which is provided inside the frame form of the support substrate; first torsion bars which, being provided between the support substrate and the movable portion, connect the movable portion to the support substrate; a first drive coil which is wound a plurality of turns on the peripheral edge of the principal surface of the movable portion; a smoothing layer which, being provided on the front surface of the movable portion, fills the space between adjacent turns of the drive coil, flattening the front surface of the movable portion; and a reflective layer which, being provided on the front surface of the smoothing layer, reflects light.

In the mirror device disclosed in the present application, the front surface of the movable portion including the first drive coil is flattened by the smoothing layer, and the reflective layer is provided on the front surface of the smoothing layer, thus enabling the reflective layer to be provided on the whole region of the movable portion, so that it is possible to realize a large-area reflective layer without increasing the weight of the movable portion.

The foregoing and other object, features, aspects, and advantages of the present application will become more apparent from the following detailed description of the present application when taken in conjunction with the accompanying drawings.

DETAILED DESCRIPTION OF THE PREFERRED EMBODIMENTS

Figure 1:
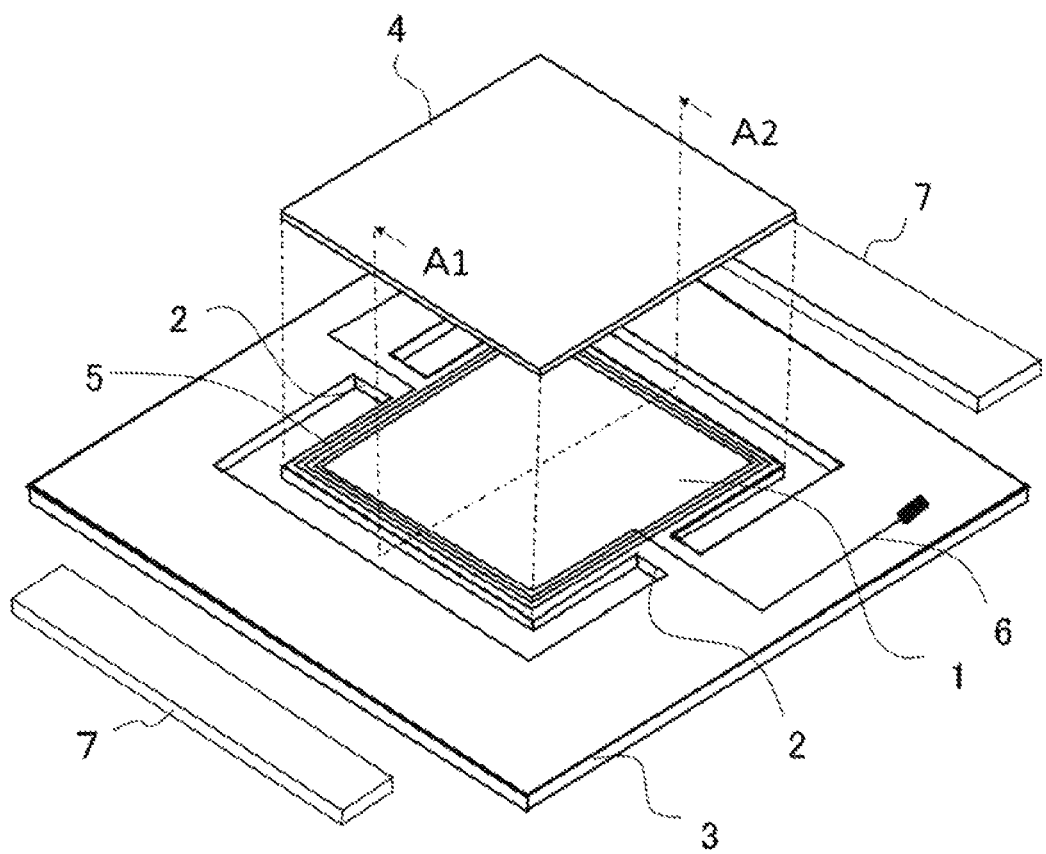
FIG. 1 is a partially exploded perspective view showing the configuration of a mirror device according to a first embodiment of the present application.

A description will be given, in accordance with the drawings, of a mirror device disclosed in the present application.

The drawings are schematic and give a conceptual description of functions structures. Also, in the drawings, portions of the same sign are identical or equivalent to each other.

First Embodiment

Figure 2:
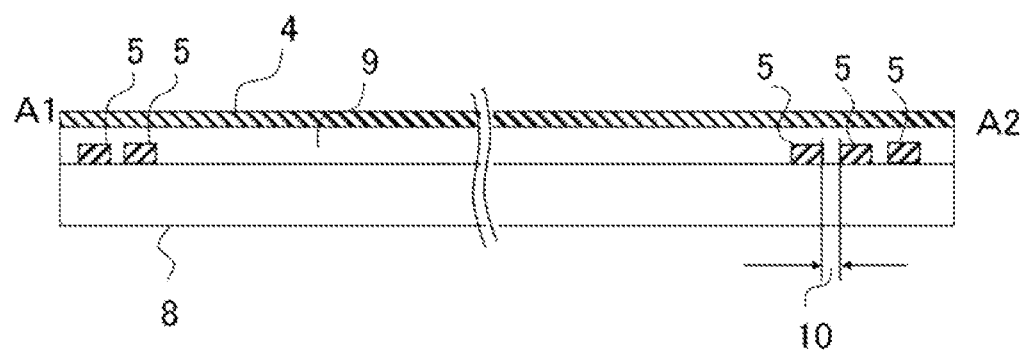
FIG. 2 is a sectional view taken along the line A1-A2 of FIG. 1.

FIG. 1 is a partially exploded perspective view of a mirror device according to a first embodiment, and FIG. 2 shows an A1-A2 sectional view of a movable portion. As shown in FIGS. 1 and 2, the mirror device has a movable portion 1, torsion bars 2, and a support substrate 3 configured as one unity. The support substrate 3 is of a frame form. The movable portion 1 is provided inside the frame-formed support substrate 3. All the principal surface of the movable portion 1 is covered with a reflective layer 4. A drive coil 5 provided underlying the reflective layer 4 is electrically connected to electrical wirings 6. Magnetic field generating portions 7 are provided on the perimeter of the support substrate 3, and the movable portion 1 supported by the torsion bars 2 is oscillated by a Lorentz force produced by causing current to flow through the drive coil 5.

The drawing shows the state in which the magnetic field generating portions 7 are provided outside the support substrate 3. In the event that a magnetic field is applied to the drive coil 5, however, it does not matter wherever the magnetic field generating portions 7 are positioned; for example, they may be installed on the rear side of the mirror device. When the magnetic field generating portions 7 are installed on the outer perimeter of the support substrate 3, the magnetic force decreases further away from the magnetic field generating portions 7, so that in order to increase the Lorentz force, the magnetic field generating portions 7 are preferably brought as close to the drive coil 5 as possible.

The movable portion 1 is of a structure, as shown in FIG. 2, in which the drive coil 5 is formed on the principal surface of a parent material 8, surface irregularities caused by the drive coil 5 are flattened using a smoothing layer 9, and the reflective layer 4 is formed on the smoothing layer 9. That is, the drive coil 5 is provided, looped in coils at predetermined intervals, on a front surface of the principal surface of the parent material 8, thereby forming the space between the wound coils. The space is filled with the smoothing layer 9, thereby flattening the principal surface.

When comparing a heretofore known mirror device and the mirror device according to the first embodiment, in the heretofore known mirror device, the irregularities are caused by the drive coil 5, so that the reflective layer 4 is provided only inside the region in which the drive coil 5 is wound, while in the mirror device according to the first embodiment, a configuration is adopted such that the surface irregularities caused by the drive coil 5 are flattened using the smoothing layer 9, and the reflective layer 4 is formed on the front surface of the smoothing layer 9, thus enabling an increase in the area of the reflective layer 4. By adopting this kind of configuration, the weight increases by an amount equivalent to that of the smoothing layer 9. However, there is little affect because the parent material 8 is dominant in weight. The area of the reflective layer increases by an amount equivalent to the region of the front surface portion in which the drive coil 5 is provided, as compared with in the heretofore known mirror device.

For example, the axial direction of the torsion bars 2 is set to be longitudinal, and when it is taken that the dimensions of the parent material 8 are 6 mm in length a and 4 mm in width b, a number of turns n of the drive coil 5 is five, a width L of the drive coil 5 is 30 μm, and a space 10 between adjacent turns of the drive coil 5 is 5 μm, an area S in which the drive coil 5 is disposed is $2(L+S)n \times \{a+b-2(L+S)n\}$, so that when the numerical values are assigned, the solution about 3.4 mm². Consequently, an area of 20.6 mm² obtained by subtracting 3.4 mm² from an area a×b of 24 mm² of the parent material 8 is used in the heretofore known mirror device, while the area 24 mm² of the parent material 8 can be used as the area of the reflective layer 4, thus enabling the area of the reflective layer 4 to increase by about 16%.

Also, the drive coil 5 cannot be formed in the central portion of the parent material 8 in the heretofore known mirror device, but the smoothing enables the drive coil 5 to be provided all the way to the center of the parent material 8, and the number of turns of the drive coil 5 can be increased, as a result of which drive force increases, enabling an increase in the deflection angle of the mirror device. For example, when the number of turns n of the drive coil 5 is changed from five to ten, the Lorentz force is doubled, so that the deflection angle is doubled. Strictly speaking, however, the drive coil 5 is wound toward the inside of the parent material 8, so that the length of each turn of coil on and after the second lap shortens by 2(L+S) per lap. Consequently, even though the number of turns is doubled, the Lorentz force is not doubled, and the deflection angle is not doubled either. Also, when the number of turns of the drive coil 5 is increased, coil resistance increases, raising a concern over a deterioration in drive characteristics due to heat generation. However, an optimal number of turns can be set while taking into consideration these facts.

Next, a description will be given, referring to FIGS. 3A to 3D and FIGS. 4A to 4C, of a method of manufacturing the mirror device according to the present embodiment.

Figure 3A:
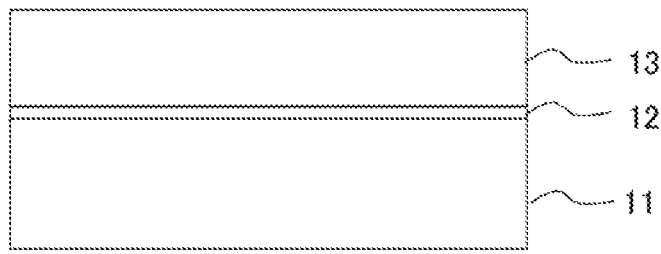
FIG. 3A is a process diagram for manufacturing the mirror device according to the first embodiment of the present application.

First, as shown in FIG. 3A, a silicon-on-insulator (SOI) substrate is prepared. The SOI substrate has a structure in which a buried oxide (BOX) layer 12 made of silicon oxide and an active layer 13 made of silicon are sequentially bonded to the front surface a holding substrate 11 made of silicon. The BOX layer 12 serves as a hard mask when processing the rear surface of the SOI substrate as shown in FIG. 4C. The film thickness is set to, for example, 500 µm for the holding substrate 11, 1 µm for the BOX layer 12, and 60 µm for the active layer 13. FIGS. 3A to 3D and FIGS. 4A to 4C schematically represent the configuration without regard to the dimensions.

In the first embodiment, the thickness of the active layer 13 is set to be the same as that of the parent material of the movable portion 1. However, the thickness of the active layer 13 can be reduced, for example, by being processed by grinding before the process moves to the step shown in FIG. 3B. Alternatively, the thickness of the active layer 13 can be conformed to that of the parent material 8 by being etched using an etching unit or an etchant, so that in this step, there is no problem even though the parent material 8 of the movable portion 1 and the active layer 13 differ in thickness from one another.

Figure 3B:
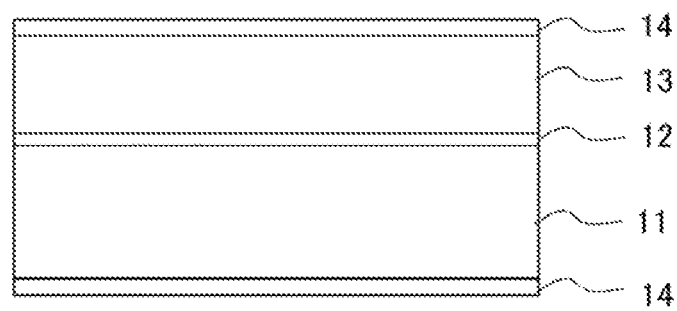
FIG. 3B is a process diagram for manufacturing the mirror device according to the first embodiment of the present application.
Figure 3C:
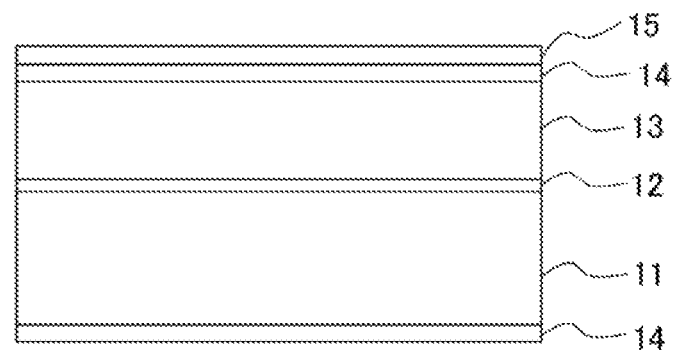
FIG. 3C is a process diagram for manufacturing the mirror device according to the first embodiment of the present application.

Next, as shown in FIG. 3B, first oxide films 14 are formed one on each surface of the SOI substrate by thermal oxidation. The first oxide films 14 are used as a mask when implanting ion. The first oxide films 14 formed are selectively removed using photolithography. The thickness of the first oxide films 14 to be formed is set to, for example, 0.5 µm.

Subsequently, a process, such as ion implantation, is executed to form piezoresistance. After the piezoresistance is formed, a second oxide film 15 is formed as a field oxide film, as shown in FIG. 3O. This provides insulation between elements. The film thickness of the second oxide film 15 is set to, for example, 1 µm.

Figure 3D:
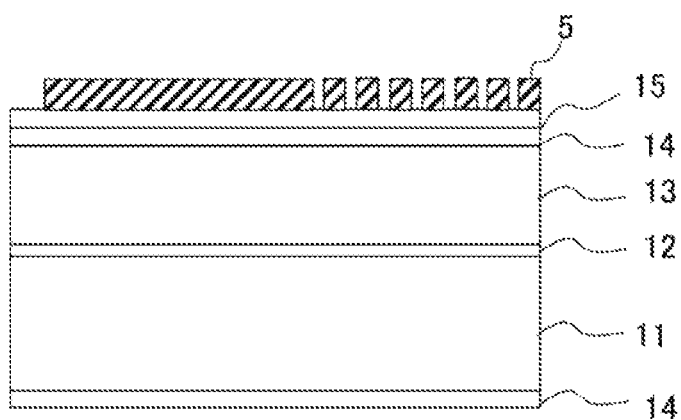
FIG. 3D is a process diagram for manufacturing the mirror device according to the first embodiment of the present application.

Following that, the drive coil 5 and the electrical wirings 6 are formed as in FIG. 3D. The drive coil 5 and the electrical wirings 6 are formed of, for example, aluminum or copper, wherein the thickness is set to be on the order of 1.8 µm, and the turn intervals of the drive coil 5 are set so that the width L of the drive coil 5 is 30 µm, the space 10 between adjacent turns of the drive coil 5 is 10 µm, and the number of turns n of the drive coil 5 is 15.

When the space 10 between adjacent turns of the drive coil 5 is large, while the thickness of the smoothing layer 9 to be formed in the next step is small, tens to hundreds of nanometer-sized depressed portions occur on the smoothing layer 9 which fills between adjacent turns of the drive coil 5. For this reason, the space 10 between adjacent turns of the drive coil 5 is preferably small. For example, when the drive coil 5 and the smoothing layer 9 are formed to a thickness of 3 µm and 4 µm, respectively, the space 10 between adjacent turns of the drive coil 5 is changed from 5 µm to 4 µm, thereby shallowing the depressed portions by on the order of 0.03 µm.

Figure 4A:
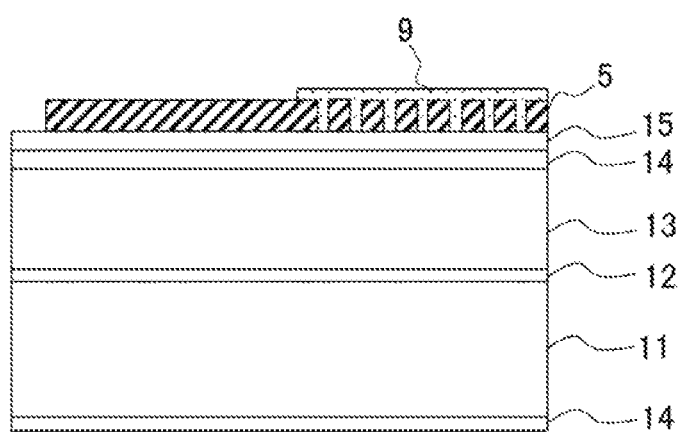
FIG. 4A is a process diagram for manufacturing the mirror device according to the first embodiment of the present application.

Next, as shown in FIG. 4A, the smoothing layer 9 is formed to reduce the irregularities of the front surface of the parent material 8 which are caused by forming the drive coil 5. The formation of the smoothing layer 9 is such that unevenness caused by the drive coil 5 is filled in with a material applied by, for example, spin coating or spray coating. When large unevenness occurs by forming the drive coil 5, a material low in viscosity and heavy in weight is used in advance, thereby preventing air bubbles from remaining in uneven portions resulting from the irregularities caused by the drive coil 5, thus facilitating the smoothing. The thickness of the smoothing layer 9 is desirably such, for example, that the space 10 between adjacent turns of the drive coil 5 is smoothed out, and that the smoothing layer 9 is formed to a certain value of film thickness on the drive coil 5.

A certain value of film thickness, which is referred to here, means that it serves as the insulation between the drive coil 5 and the reflective layer 4. Furthermore, the smoothing layer 9 also serves as a protective layer with which to protect the drive coil 5.

A material for the smoothing layer 9 includes, for example, epoxy resin or acrylic resin. As a step in which to implement a smoothing process, for example, the step of applying a resist after applying a smoothing material and of selectively etching the smoothing layer 9 formed on the drive coil 5 may be implemented a plurality of times. Also, the method may be used polishing a convex portion of the smoothing material which is raised by the drive coil 5 is polished and flattened. Alternatively, the method may also be used of forming trenches in advance and of embedding metal therein and carrying out etching back by grinding.

Figure 4B:
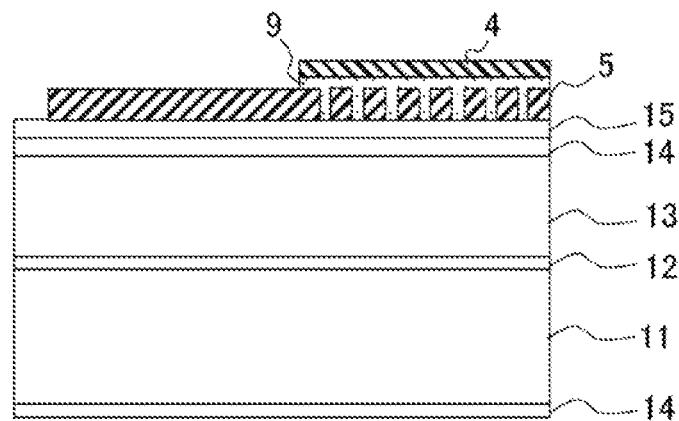
FIG. 4B is a process diagram for manufacturing the mirror device according to the first embodiment of the present application.
Figure 4C:
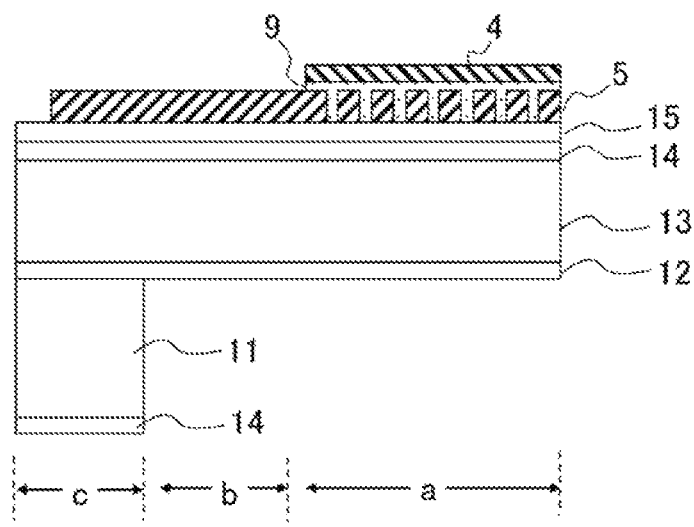
FIG. 4C is a process diagram for manufacturing the mirror device according to the first embodiment of the present application.

Next, the reflective layer 4 is formed, as shown in FIG. 4B. A metallic thin film with a high reflectance in the wavelength of light to be used is desirable for the reflective layer 4. As the material of the metallic thin film, for example, titanium (Ti), aluminum (Al), copper (Cu), silver (Ag), or gold (Au) is used.

Next, as shown in FIG. 4C, the active layer 13, the BOX layer 12, and the holding substrate 11 are etched, fabricating a region a for the movable portion 1, a region b for the torsion bars 2, and a region c for the support substrate 3, thus obtaining the finished mirror device. When etching the holding substrate 11, the etching starts with the rear surface thereof.

When the axial direction of the torsion bars 2 are set to longitudinal, the external dimensions of the movable portion 1 are set to, for example, 6 mm in length, 4 mm in width, and 60 µm in thickness. Also, the external dimensions of the torsion bars 2 are set to, for example, 1 mm in length and 200 µm in width. Here, the movable portion 1 is rectangular in shape, but may be, for example, polygonal, circular, or elliptical.

Although the individual configurations according to the present embodiment are not limited to the above described configurations, it goes without saving that the same advantageous effect can be obtained for any external dimensions as long as the conditions are met that the irregularities caused by forming the drive coil 5 are smoothing processed and the reflective layer 4 is provided on the upper layer thereof. Manufacturing method steps in the second and the subsequent embodiments are the same as in the first embodiment and so will be omitted from being described, and a description will be given of differing portions.

Second Embodiment

The stress produced by torsional deformation when driving the mirror device shows a high value in the vicinity of the centers of the torsion bars 2 and in the vicinity of the corners of the connections between the movable portion 1 and the torsion bars 2. The high value seen in the vicinity of the centers of the torsion bars 2 results mainly from shearing stress, and the high value seen in the vicinity of the corners of the connections between the movable portion and the torsion bars 2 results mainly from tensile stress. The intensity of the stress changes to some extent depending on the deflection angle of the mirror device or on a material and a film thickness which are used for the smoothing layer 9. In general, this kind of mirror device carries out repeated movements for a long time, so that the stress acts repeatedly on these portions. As a result, when the smoothing layer 9 is formed in the portions on which the stress concentrates, there is fear that a crack occurs in the smoothing layer 9 and, furthermore, that the drive of the mirror device is adversely affected. In particular, as shown in the first embodiment, when the drive coil 5 is provided all the way to the center of the movable portion 1 and the front surface of the movable portion 1 is flattened by filling the irregularities between adjacent turns of the drive coil 5 with the smoothing layer 9, the weight increases, albeit only slightly, so that it is necessary to take into account the stress produced by torsional deformation. In a second embodiment, the portions in the vicinity of the corners of the connections between the movable portion 1 and the torsion bars 2, in the first embodiment, are defined as stress concentration portions, thereby responding to the problems created by the stress concentration.

Figure 5:
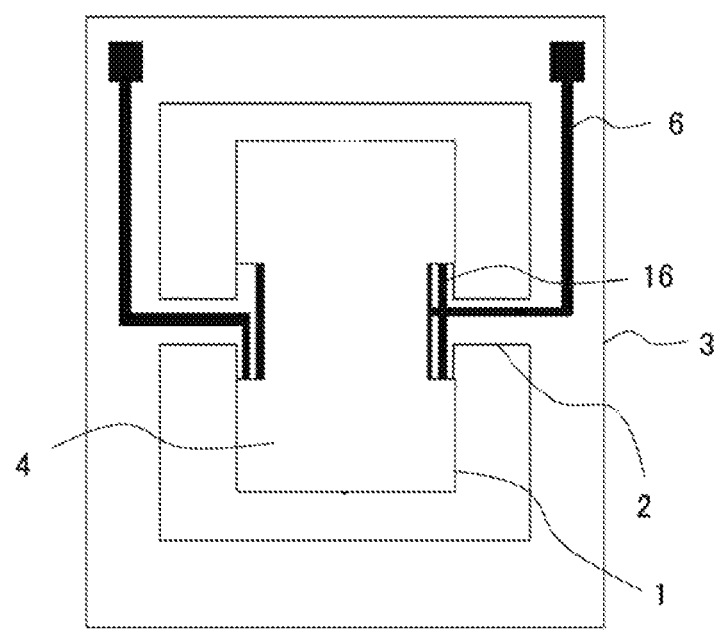
FIG. 5 is a plan view of a mirror device according to a second embodiment of the present application.
Figure 6:
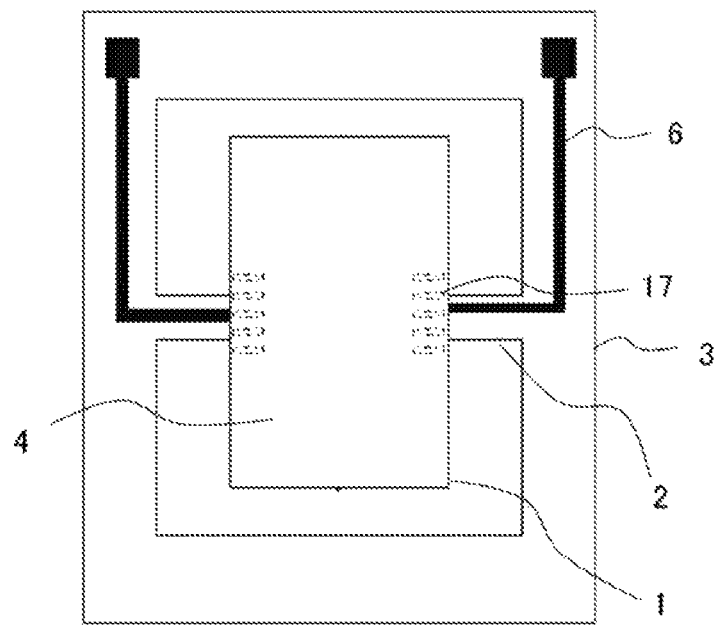
FIG. 6 is a plan view of the mirror device according to the second embodiment of the present application.

FIGS. 5 and 6 each show a plan view of the mirror device according to the second embodiment. The magnetic field generating portions 7 of the mirror device are omitted from the following plan views.

FIG. 5 shows that regions in which neither the reflective layer 4 nor the smoothing layer 9 is provided are set in the movable Portion 1 as the regions correspond to stress concentration portions 16 in the vicinity of the connections between the movable portion 1 and the torsion bars 2. Also, FIG. 6 shows that a plurality of slits 17 are formed in each of the regions of the smoothing layer 9 which correspond to the stress concentration portions 16 in the vicinity of the corners of the connections between the movable portion 1 and the torsion bars 2. The slits 17 shown in FIG. 6 are shaped to be smaller in width than a laser wavelength used in LiDAR. By so doing, diffraction occurring when light is transmitted and received can be reduced depending on the diffraction limit of the light. As shown in FIG. 5, a configuration is such as not to form the smoothing layer 9 in the stress concentration portions 16, thereby relaxing strain caused by stress concentration. That is, by providing a region where the smoothing layer 9 and the reflecting layer 4 are not provided, two effects can be obtained: an effect of preventing film peeling due to stress and an effect of improving optical characteristics by reducing warpage of the mirror.

Also, as shown in FIG. 6, the plurality of slits 17 are provided in the regions of the smoothing layer 9 which correspond to the stress concentration portions 16, thereby enabling a relaxation of stress concentration.

The stress concentration portions 16 in which neither the reflective layer 4 nor the smoothing layer 9 is provided are formed by, after forming the reflective layer 4 shown in, for example, FIG. 4B, selectively removing it using photolithography. Also, after forming the smoothing layer 9 shown in FIG. 4A, the slits 17 may be formed in portions under which the drive coil 5 does not exist. By so doing, the reflective layer 4 which is to be formed on the drive coil 5 in the next step can be prevented from being electrically connected to the drive coil 5.

The slits 17 do not have to be formed parallel to the torsion bars 2. For example, the slits 17 may be formed arcuate and be discretely distributed.

Third Embodiment

Figure 7:
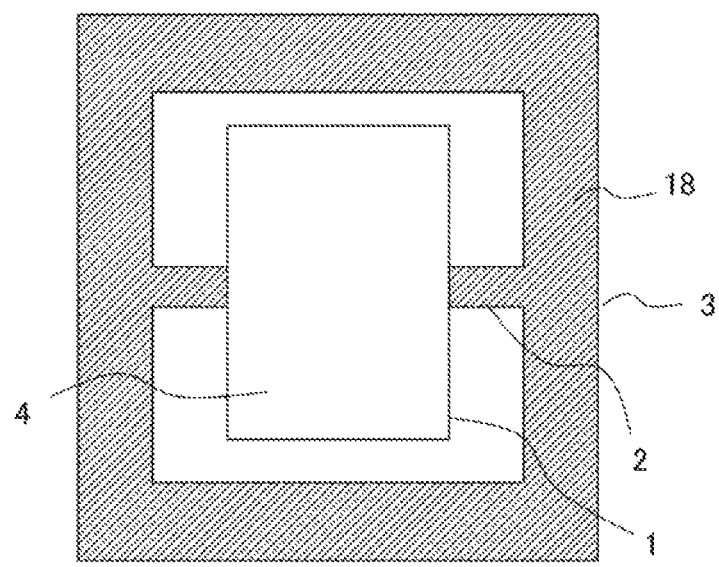
FIG. 7 is a plan view of a mirror device according to a third embodiment of the present application.

FIG. 7 shows one example of a third embodiment. The example in FIG. 7 is of a structure including a covering layer 18 on the principal surfaces of both the torsion bars 2 and the support substrate 3. In the third embodiment, as compared with in the first embodiment, the electrical wirings (shown in FIGS. 5 and 6) formed on both the torsion bars 2 and the support substrate 3 are covered with the covering layer 18, thereby improving the optical property and environment resistance of the mirror device.

The covering layer 18 is fabricated after forming the smoothing layer 9 or the reflective layer 4 as shown in, for example, FIGS. 4B and 4C.

The covering layer 18 is such that a film with a low reflectance compared with that of the reflective layer 4 is formed on the front surface of both the support substrate 3 and the electrical wirings 6 formed on the support substrate 3, both of which are relatively large in surface area among the components around the reflective layer 4, thereby reducing unnecessary light reflection, enabling an improvement in the optical property of the mirror device. That is, as shown in FIG. 4C, in the state in which the region a of the movable portion 1, the region b of the torsion bar 2, and the region c of the support, substrate 3 are fabricated, the electrical wirings connected to the drive coil 5 are exposed. The electrical wirings are as high in reflectance as the reflective layer 4, possibly causing false detection of a reflection from the electrical wirings. For this reason, a configuration is adopted such as to cover a high reflectance component with the covering layer 18. As the covering layer 18, for example, low reflectance carbon black is formed in portions other than the reflective layer 4, and thereby the distinguishing of the reflective layer 4 can be carried out with precision, enabling an improvement in the optical property of the mirror device. When providing the covering layer 18 only on the front surface of a limited region, a region to be covered can be set using a mask.

Figure 8:
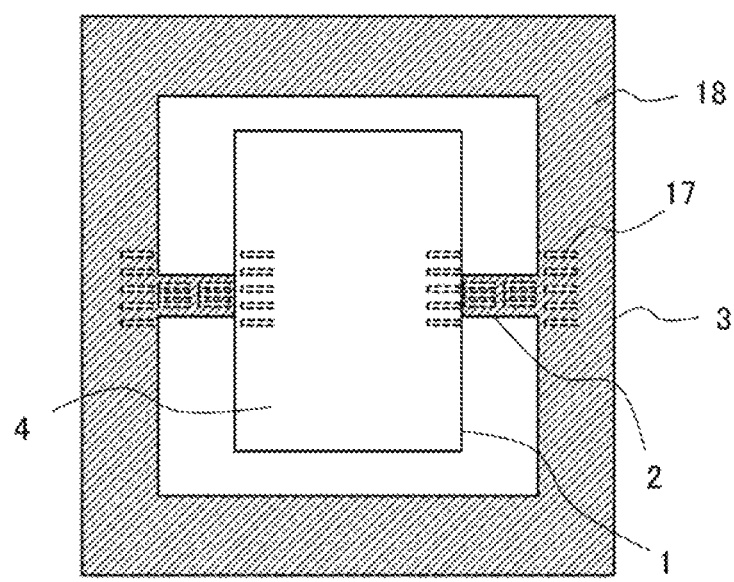
FIG. 8 is a plan view of the mirror device according to the third embodiment of the present application.

The plurality of slits 17 are also provided in stress concentration portions in the vicinity of the centers of the torsion bars 2 and in the vicinity of the corners of the connections between the support substrate 3 and the torsion bars 2. That is, as shown in FIG. 8, the slits 17 are formed in portions shown in the second embodiment, in which there is concern that a crack occurs due to stress, for example, both in the stress concentration portions of the connections between the movable portion 1 and the torsion bars 2 and in the stress concentration portions of the connections between the torsion bars 2 and the support substrate 3, and thereby it is possible to solve the problems created by implementing the first embodiment.

Fourth Embodiment

Figure 9:
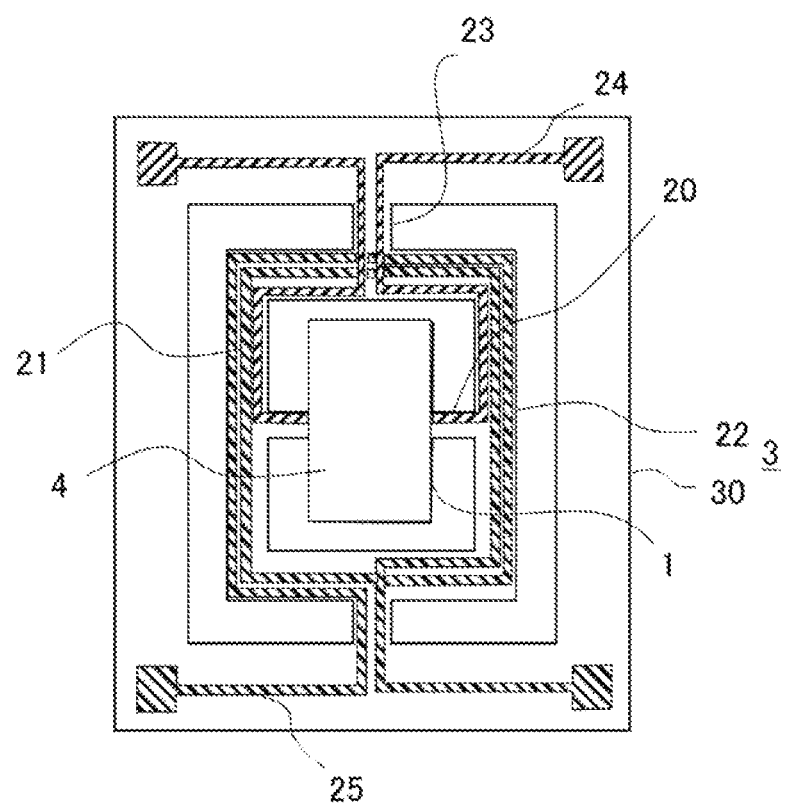
FIG. 9 is a plan view of a mirror device according to a fourth embodiment of the present application.

FIG. 9 shows one example of a fourth embodiment. FIG. 9 is a plan view showing the principal surface of the mirror device. The mirror device according to the fourth embodiment is such that the support substrate 3 is configured of an intermediate frame 22 and an outside frame 30, wherein the movable portion 1 is connected to the intermediate frame 22 by inside torsion bars 20 acting as first torsion bars, and the intermediate frame 22 is connected to the outside frame 30 by outside torsion bars 23 acting as second torsion bars. That is, a structure is such that the movable portion wherein an inside drive coil 19, the smoothing layer 9, and the reflective layer 4 are formed in sequence on the parent material 8 is supported from the intermediate frame 22 by the inside torsion bars 20, the respective other ends of the inside torsion bars 20 are connected to the inner circumference of the intermediate frame 22 on which are provided an outside drive coil 21 acting as a second drive coil, the outer circumference of the intermediate frame 22 is supported by the outside torsion bars 23 oriented in a direction perpendicular to the inside torsion bars 20, and the respective other ends of the outside torsion bars 23 are connected to the outside frame 30 of the support substrate 3.

The inside drive coil 19, being connected to first electrical wirings 24, is connected to the outside frame 30 by way of the inside torsion bars 20, the intermediate frame 22, and the outside torsion bar 23, while the outside drive coil 21, being connected to second electrical wirings 25, is connected to the outside frame 30 by way of the outside torsion bar 23. The magnetic field generating portions 7 are provided outside the outside frame 30, wherein by causing current to flow through the inside and outside drive coils 19 and 21, the inside and outside torsion bars 20 and 23 are twisted, oscillating the movable portion 1. In the fourth embodiment, the number of torsion bars 2 is increased as compared with in the first embodiment, thereby enabling biaxial drive, enabling an operation such as Lissajous scanning or raster scanning.

The movable portion 1 moves in conjunction with the movement of the inside and outside torsion bars 20 and 23, and the intermediate frame 22 moves in conjunction with the movement of the outside torsion bars 23. Consequently, in some cases, the movable portion 1 and the intermediate frame 22 face in different directions from one another. When the outside drive coil 21 is exposed, reception light reflects from the outside drive coil 21, meaning that a piece of light which does not head in its original direction is sent to a light detector (not shown), and there is a possibility of false detection. For this reason, the outside drive coil 21 is covered with the smoothing layer 9 or the covering layer 18, thereby reducing the amount of reflection, enabling a reduction in the false detection by the light detector.

The mirror device of the structure shown in the fourth embodiment can be fabricated by the manufacturing method shown in FIGS. 3A to 3D and FIGS. 4A to 4C.

Figure 10:
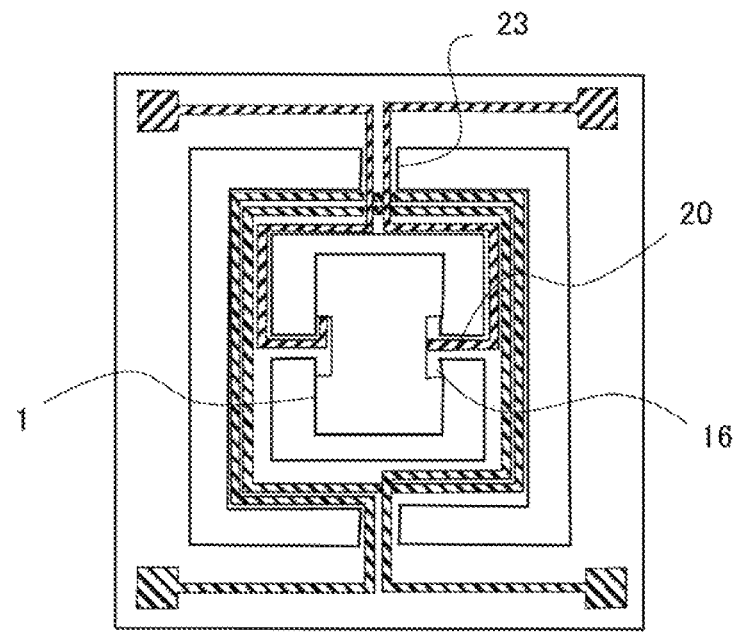
FIG. 10 is a plan view of the mirror device according to the fourth embodiment of the present application.
Figure 11:
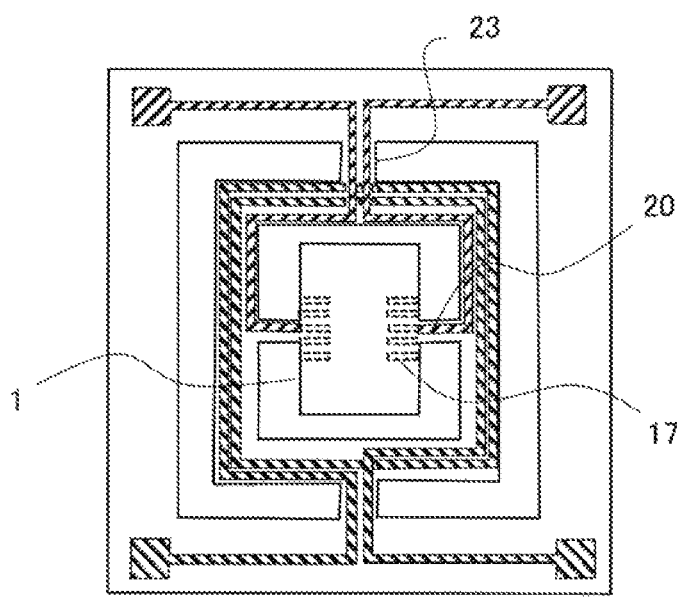
FIG. 11 is a plan view of the mirror device according to the fourth embodiment of the present application.

The response to the stress concentration, shown in the second embodiment, can be combined with the structure of the mirror device according to the fourth embodiment. For example, the configuration of FIG. 5 in the second embodiment and the configuration of FIG. 9 in the fourth embodiment are combined together, adopting a configuration such that no reflective layer is provided in the stress concentration portions 16 in the vicinity of the connections between the movable portion 1 and the inside torsion bars 20, as shown in FIG. 10. Alternatively, the configuration of FIG. 6 in the second embodiment and the configuration of FIG. 9 in the fourth embodiment are combined together, and thus it is possible, as shown in FIG. 11, to adopt a configuration such that slits are provided in the stress concentration portions 16 in the vicinity of the connections between the movable portion 1 and the inside torsion bars 20.

Figure 12:
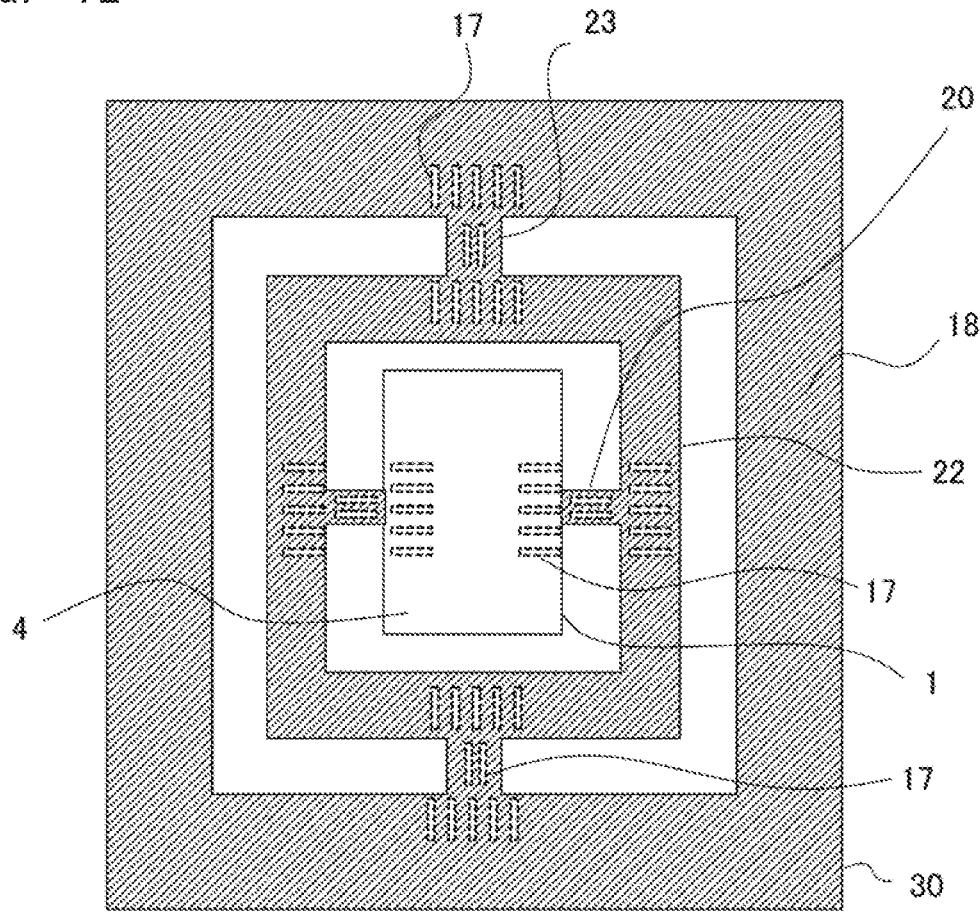
FIG. 12 is a plan view of the mirror device according to the fourth embodiment of the present application.

Furthermore, the structure of the covering layer 18 shown in the third embodiment is combined with the structure of the mirror device according to the fourth embodiment, and thus a region in which the covering layer 18 is not formed can be provided in a portion on which stress concentrates. Also, as shown in FIG. 12, a configuration is adopted such that the slits 17 are provided in the stress concentration portions of the movable portion 1, the inside torsion bars 20, the intermediate frame 22, the outside torsion bars 23, and the outside frame 30, and that portions other than the reflective layer 4 are covered with the covering layer 18, and thereby it is possible to achieve the advantageous effects acquired by the third and fourth embodiments.

Fifth Embodiment

Figure 13:
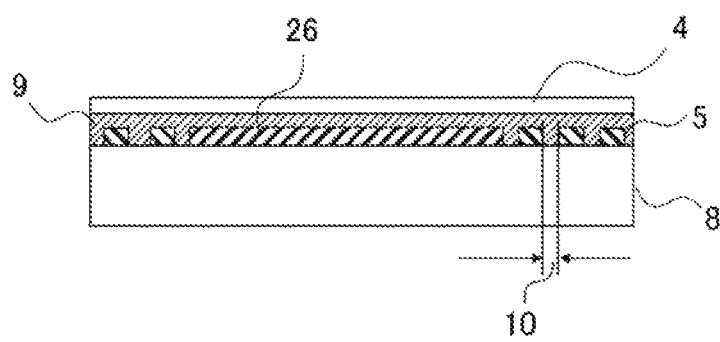
FIG. 13 is a plan view of a mirror device according to a fifth embodiment of the present application.

FIG. 13 shows one example of a fifth embodiment. FIG. 13 is a sectional view of the movable portion 1. The fifth embodiment is of a structure which includes a dummy portion 26, which is not connected to the drive coil 5 or the inside drive coil 19, in the central portion of the movable portion 1 in which the drive coil 5 shown in the first to third embodiments or the inside drive coil 19 shown in the fourth embodiment is not formed. As described in the manufacturing method in the first embodiment, when the space 10 between adjacent turns of the drive coil 5 is large, the depressed portions occurring on the smoothing layer 9 are large.

In order not to cause the depressed portions to occur, there is a method of forming the smoothing layer 9 to a large thickness, but when the thickness of the smoothing layer 9 is too large, there is fear that the movable portion 1 increases in weight, reducing the deflection angle. For this reason, the dummy portion 26 is provided as an embedded member. In particular, when the drive coil 5 is not provided all the way to the center of the movable portion 1, the peripheral edge portion of the movable portion 1 is higher than the central portion thereof due to the existence of the drive coil 5. Because of this, the central portion of the movable portion 1 is depressed. The dummy portion 26 is provided in order to eliminate this depression. By providing the dummy portion 26, for example, a 1.8-µm depressed portion which should have occurred when a 2.5-mm long space exists can be reduced to 0.04 µm. The depressed portion can be set depending on the thickness of the dummy portion 26 and the viscosity of a material to be used for the smoothing layer 9 or the film thickness of the material to which it is to be formed. The dummy portion 26 may be of any material as long as it is a material with which a desired pattern can be formed. The provision of the dummy portion 26 as the embedded member can also be implemented in the same way, and has the same advantageous effect, as in the first embodiment.

Sixth Embodiment

Figure 14:
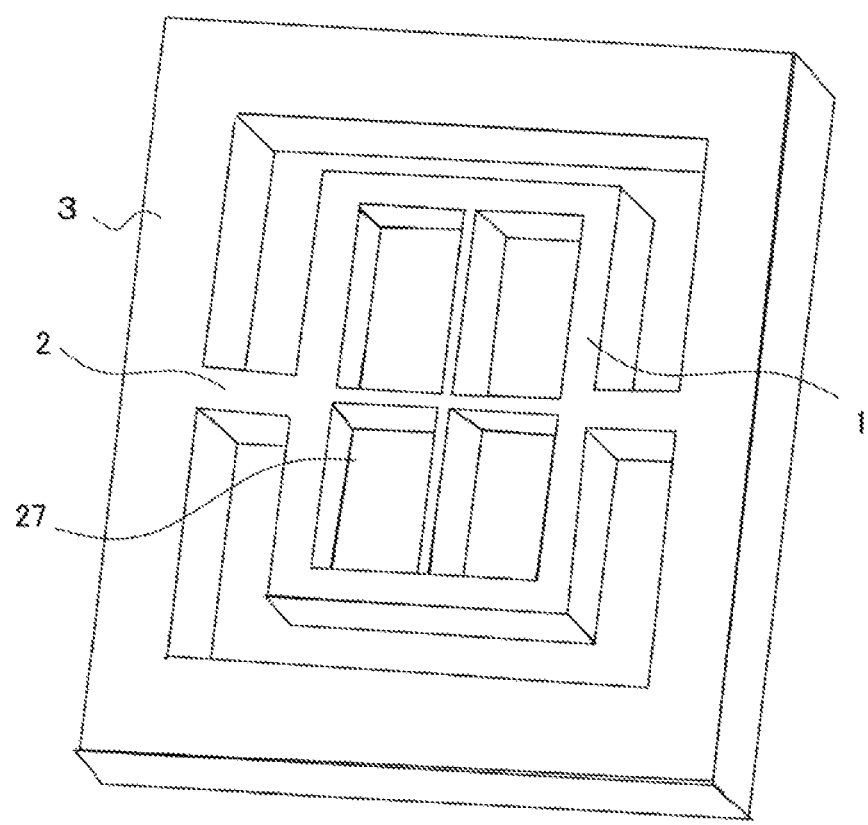
FIG. 14 is a perspective view of the rear surface a mirror device according to a sixth embodiment of the present application.

FIG. 14 shows one example of a sixth embodiment. FIG. 14 shows the shape of the rear surface of the mirror device, that is, the shape of a surface opposite to the surface on which the reflective layer 4 is formed. In FIG. 14, a plurality of lightening portions 27 are formed in the rear surface of the movable portion 1. In the sixth embodiment, as compared with in the first embodiment, this enables a reduction in the weight of the mirror device, and also, the mirror device can have a structure which is not likely to undergo warpage by creating a portion provided with no lightening portion 27. The lightening portions 27 which are formed in the rear surface of the movable portion 1 can be formed at the same time, for example, in the step shown in FIG. 40, that is, in a step of processing the shape of the rear surface. Also, in the mirror device shown in the fourth embodiment, the lightening portions 27 may be formed in the intermediate frame 22. By so doing, the intermediate frame 22 can be reduced in weight, and the deflection angle on the second axial side of the mirror device can be increased. The lightening portions 27 to be formed in the rear surface of the intermediate frame 22 can also be formed by carrying out the formation of the lightening portions 27 at the same time as, for example, in the step shown in FIG. 4C, that is, in the step of processing the shape of the rear surface. The lightening portions 27 to be formed can be fabricated in various patterns, such as a zonal pattern, a matrix pattern, and a honeycomb pattern.

Although the present application is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the embodiments.

It is therefore understood that numerous modifications which have not been exemplified can be devised without depart in from the scope of the present application. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A mirror device, comprising:
a support substrate of a frame form;
a movable portion which is provided inside the frame form of the support substrate;
first torsion bars which, being provided between the support substrate and the movable portion, connect the movable portion to the support substrate;
a first drive coil which is wound a plurality of turns on the peripheral edge of the principal surface of the movable portion;
a smoothing layer which, being different from the movable portion and provided on the front surface of the movable portion including the first drive coil, fills the space between adjacent turns of the first drive coil and covers an upper surface of the first drive coil, flattening the front surface of the movable portion; and
a reflective layer which, being provided on the front surface of the smoothing layer, reflects light.

2. The mirror device according to claim 1, wherein
the reflective layer is provided in a region of the front surface of the movable portion excluding stress concentration portions of the connections between the movable portion and the first torsion bars.

3. The mirror device according to claim 1, wherein
slits are provided in the stress concentration portions of the connections of the movable portion to the first torsion bars.

4. The mirror device according to claim 1, wherein
slits are provided in the stress concentration portions of the first torsion bars.

5. The mirror device according to claim 1, wherein
a covering layer lower in light reflectance than the reflective layer is provided on the front surface of the support substrate.

6. The mirror device according to claim 5, wherein
the light reflectance of the covering layer is lower than the reflectance of a component covered with the covering layer.

7. The mirror device according to claim 5, wherein
the covering layer is provided in a region of the front surface of the movable portion excluding the stress concentration portions of the connections between the movable portion and the first torsion bars.

8. The mirror device according to claim 1, wherein
an embedded member is provided in the front surface of the movable portion, and the front surface of the movable portion including the embedded member is flattened by the smoothing layer.

9. The mirror device according to claim 1, wherein
one or more lightening portions exist in a surface of the movable portion opposite to the surface thereof on which the reflective layer is provided.

10. The mirror device according to claim 1, wherein
the support substrate is configured of an intermediate frame which supports the movable portion and an outside frame provided outside the intermediate frame, wherein the intermediate frame and the outside frame are connected together by second torsion bars oriented in a direction perpendicular to the first torsion bars, and a second drive coil is wound a plurality of turns on the peripheral edge of the principal surface of the intermediate frame.

11. The mirror device according to claim 10, wherein
a covering layer lower in light reflectance than the reflective layer is provided on at least one of the respective front surfaces of the intermediate and outside frames.

12. The mirror device according to claim 11, wherein
the covering layer is provided in a region of the front surface of the intermediate frame excluding the stress concentration portions of the connections between the intermediate frame and the first torsion bars.

13. The mirror device according to claim 11, wherein
slits are provided in at least either the stress concentration portions of the connections between the intermediate frame and the second torsion bars or the stress concentration portions of the connections between the outside frame and the second torsion bars.

14. The mirror device according to claim 11, wherein
slits are provided in the stress concentration portions of the second torsion bars.

15. The mirror device according to claim 10, wherein
one or more lightening portions exist in a surface of the intermediate frame opposite to the surface thereof on which the reflective layer is provided.

* * * * *